(12) United States Patent
Bedworth et al.

(10) Patent No.: US 9,011,570 B2
(45) Date of Patent: Apr. 21, 2015

(54) ARTICLES CONTAINING COPPER NANOPARTICLES AND METHODS FOR PRODUCTION AND USE THEREOF

(75) Inventors: Peter V. Bedworth, Palo Alto, CA (US); Alfred A. Zinn, Palo Alto, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 965 days.

(21) Appl. No.: 13/079,757

(22) Filed: Apr. 4, 2011

(65) Prior Publication Data

US 2012/0251381 A1 Oct. 4, 2012

(51) Int. Cl.
   *B22F 1/00* (2006.01)
   *C09K 5/14* (2006.01)
   *H01L 23/00* (2006.01)
   *C22C 9/00* (2006.01)

(52) U.S. Cl.
   CPC . *C09K 5/14* (2013.01); *H01L 24/29* (2013.01); *C22C 9/00* (2013.01); *H01L 2924/15747* (2013.01); *H01L 2224/838* (2013.01); *B22F 1/0018* (2013.01)

(58) Field of Classification Search
   USPC .......................................................... 75/252
   See application file for complete search history.

(56) References Cited

U.S. PATENT DOCUMENTS

| | | | |
|---|---|---|---|
| 5,159,171 A | 10/1992 | Cook et al. | |
| 5,800,650 A | 9/1998 | Anderson et al. | |
| 5,958,590 A | 9/1999 | Kang et al. | |
| 6,143,356 A | 11/2000 | Jablonski | |
| 6,645,444 B2 | 11/2003 | Goldstein | |
| 6,783,569 B2 | 8/2004 | Cheon et al. | |
| 7,306,823 B2 | 12/2007 | Sager et al. | |
| 7,419,887 B1 | 9/2008 | Quick et al. | |
| 7,442,879 B2 | 10/2008 | Das et al. | |
| 7,524,351 B2 | 4/2009 | Hua et al. | |
| 7,535,715 B2 | 5/2009 | Chung | |
| 7,559,970 B2* | 7/2009 | Kim et al. ........................ 75/711 |
| 7,628,840 B2 | 12/2009 | Atsuki et al. | |
| 7,637,982 B2 | 12/2009 | Hou et al. | |
| 7,736,414 B1 | 6/2010 | Zinn | |
| 7,743,964 B2* | 6/2010 | Maeda ...................... 228/180.22 |
| 7,791,153 B2 | 9/2010 | Tsurume et al. | |
| 7,847,397 B2 | 12/2010 | Wu et al. | |
| 7,850,933 B2 | 12/2010 | Yang et al. | |
| 7,858,025 B2 | 12/2010 | Shim et al. | |
| 2003/0100654 A1 | 5/2003 | Chheang et al. | |
| 2003/0146019 A1 | 8/2003 | Hirai | |
| 2004/0245648 A1 | 12/2004 | Nagasawa et al. | |
| 2005/0249967 A1 | 11/2005 | Egli | |
| 2006/0068216 A1 | 3/2006 | Hua et al. | |
| 2006/0189113 A1 | 8/2006 | Vanheusden et al. | |
| 2006/0196579 A1 | 9/2006 | Skipor et al. | |
| 2007/0202304 A1 | 8/2007 | Golovko et al. | |
| 2007/0290175 A1 | 12/2007 | Kim | |
| 2008/0003364 A1 | 1/2008 | Ginley et al. | |
| 2008/0011125 A1 | 1/2008 | Shirata et al. | |
| 2008/0032132 A1 | 2/2008 | Woodfield et al. | |
| 2008/0072706 A1 | 3/2008 | Lee et al. | |
| 2008/0124268 A1 | 5/2008 | Yang et al. | |
| 2008/0149176 A1 | 6/2008 | Sager et al. | |
| 2008/0151515 A1 | 6/2008 | Das et al. | |
| 2008/0159902 A1 | 7/2008 | Shim et al. | |
| 2008/0160183 A1 | 7/2008 | Ide et al. | |
| 2008/0278181 A1 | 11/2008 | Zhong et al. | |
| 2008/0286488 A1 | 11/2008 | Li et al. | |
| 2009/0029148 A1 | 1/2009 | Hashimoto et al. | |
| 2009/0145765 A1 | 6/2009 | Abys et al. | |
| 2009/0214764 A1* | 8/2009 | Li et al. ........................ 427/98.4 |
| 2009/0239073 A1 | 9/2009 | Huang et al. | |
| 2009/0285976 A1 | 11/2009 | Lochtman et al. | |
| 2009/0301606 A1 | 12/2009 | Ueshima | |
| 2010/0031848 A1 | 2/2010 | Lee et al. | |
| 2010/0065616 A1 | 3/2010 | Zinn | |
| 2010/0075137 A1 | 3/2010 | Sinton et al. | |
| 2010/0139455 A1 | 6/2010 | Tilley et al. | |

(Continued)

FOREIGN PATENT DOCUMENTS

| | | |
|---|---|---|
| EP | 1921176 A2 | 5/2008 |
| JP | 2009006337 A | 1/2009 |

(Continued)

OTHER PUBLICATIONS

Kanninen, et al., "Influence of Ligand Structure on the Stability and Oxidation of Copper Nanoparticles", Journal of Colloid and Interface Science 318 (2008) pp. 88-95.
Lisiecki, et al., "Control of the Shape and the Size of Copper Metallic Particles", J. Phys. Chem 1996, 100, pp. 4160-4166.
Mott, et al., "Synthesis of Size-Controlled and Shaped Copper Nanoparticles", Langmuir 2007, 23, pp. 5740-5745.
Wu, et al., "Simple One-Step Synthesis of Uniform Disperse Copper Nanoparticles", Mater. Res. Soc. Symp. Proc. vol. 879E, 2005 Materials Research Society, pp. Z6.3.1-Z6.3.6.
Wu, et al., "One-Step Green Route to Narrowly Dispersed Copper Nanocrystals", Journal of Nanoparticle Research (2006) pp. 965-969.
Yeshchenko, et al., "Size-Dependent Melting of Spherical Copper Nanoparticles Embedded in a Silica Matrix", Physical Review B 75 (2007), pp. 085434-1 to 085434-6.

(Continued)

*Primary Examiner* — Roy King
*Assistant Examiner* — Ngoclan T Mai
(74) *Attorney, Agent, or Firm* — McDermott Will & Emery LLP

(57) ABSTRACT

Articles containing a matrix material and plurality of copper nanoparticles in the matrix material that have been at least partially fused together are described. The copper nanoparticles are less than about 20 nm in size. Copper nanoparticles of this size become fused together at temperatures and pressures that are much lower than that of bulk copper. In general, the fusion temperatures decrease with increasing applied pressure and lowering of the size of the copper nanoparticles. The size of the copper nanoparticles can be varied by adjusting reaction conditions including, for example, surfactant systems, addition rates, and temperatures. Copper nanoparticles that have been at least partially fused together can form a thermally conductive percolation pathway in the matrix material.

16 Claims, 4 Drawing Sheets

(56) References Cited

U.S. PATENT DOCUMENTS

2010/0275729 A1 11/2010 Jun et al.
2010/0314578 A1 12/2010 Purdy
2010/0330686 A1 12/2010 Park

FOREIGN PATENT DOCUMENTS

| KR | 20080010691 A | 1/2008 |
|---|---|---|
| WO | WO-2006/063134 A2 | 6/2006 |
| WO | WO 2009/115643 | 9/2009 |
| WO | WO/2010/036114 | 4/2010 |

OTHER PUBLICATIONS

Pulkkinen, et al., "Poly(ethylene imine) and Tetraethylenepentamine as Protecting Agents for Metallic Copper Nanoparticles", Applied Materials & Interfaces, (2009) vol. 1, No. 2, pp. 519-525.
Kang, et al., "Inkjet Printed Electronics Using Copper Nanoparticle Ink", J Mater Sci: Mater Electron (2010) vol. 21 pp. 1213-1220.
Magdassi, et al., "Copper Nanoparticles for Printed Electronics: Routes Towards Achieving Oxidation Stability", Materials (2010) vol. 3, pp. 4626-4638.
Wang, et al., "Poly(allylamine)-Stabilized Colloidal Copper Nanoparticles: Synthesis, Morphology, and Their Surface-Enhanced Raman Scattering Properties", Langmuir Article (210) vol. 26 (10), pp. 7469-7474.
Product Description—"Cooper Nanoparticle and Cupric Salt Product Specialized Team", Suzhou Cantuo Nano Technology Co. Ltd. 2010.
Product Description—"Nano-Copper", Sun Innovations, Inc. 2005-2010.
Product Description—"Copper Nanoparticle, Cu", NaBond Technologies Co., Ltd. 2001-2009.
Product Description—"Copper Nanoparticles", American Elements 2001-2010.
Product Description—"Powders: Nanoparticles & Nanopowders", SkySpring Nanomaterials, Inc.
Product Description—"Copper Nano Powder" TradeKey 2011.
Product Description—Metal & Alloy Nanoparticles, Nanoshel 2007-2009.
Product Description—"Nanopowders" Sigma-Aldrich 2010.
Product Description—Copper Nanoparticle (Copper Nanopowder), Suzhou Canfuo Nano Technology Co., Ltd. 1997-2011.

\* cited by examiner

ARTICLES CONTAINING COPPER NANOPARTICLES AND METHODS FOR PRODUCTION AND USE THEREOF

CROSS-REFERENCE TO RELATED APPLICATIONS

This application is related to U.S. patent application Ser. No. 12/512,315, filed Jul. 30, 2009, and Ser. No. 12/813,463, filed Jun. 10, 2010. This application is also related to international patent application PCT/US2010/039069, filed Jun. 17, 2010. Each of these applications is incorporated herein by reference in its entirety.

STATEMENT REGARDING FEDERALLY SPONSORED RESEARCH OR DEVELOPMENT

Not applicable.

FIELD OF THE INVENTION

The present invention generally relates to copper nanoparticles, and, more particularly, to copper nanoparticles contained in a matrix material.

BACKGROUND

Nanoparticles can exhibit physical and chemical properties that sometimes differ significantly from those observed in the bulk material. This is particularly true for copper nanoparticles, which can exhibit a significantly reduced melting point relative to that of bulk copper. In particular, copper nanoparticles having a narrow size range and nanoparticle sizes of less than about 20 nm fuse together at much lower temperatures and pressures than do larger copper nanoparticles or bulk copper.

Although copper nanoparticles are of significant interest due, inter alia, to the widespread industrial use of bulk copper, the formation of monodisperse copper nanoparticles remains synthetically challenging. Copper nanoparticles having a narrow size range that are less than about 20 nm in size have been particularly difficult to synthesize. Solution-based chemical reduction methods have typically produced nanoparticles having irregular shape, wide size ranges, and/or nanoparticle sizes that are much larger than 20 nm. Furthermore, many methods for synthesizing copper nanoparticles are not readily amenable to scale up.

Only a limited number of scalable processes are available for producing monodisperse copper nanoparticles having small nanoparticle sizes. One readily scalable procedure for synthesizing copper nanoparticles having nanoparticle sizes below about 20 nm, more particularly below about 10 nm, involves heating a copper salt solution, a bidentate diamine (e.g., a N,N'-dialkylethylenediamine), and one or more C6-C18 alkylamines. Copper nanoparticles produced by this method have a fusion temperature of less than about 200° C., with the fusion temperature decreasing as a function of nanoparticle size. Copper nanoparticles in this size range have also been produced by the reduction of a copper salt in the presence of ascorbic acid. Although copper nanoparticles in this size range can be isolated, characterized and utilized, they do have a somewhat limited shelf life. Further, rapid oxidation of copper can take place if the copper nanoparticles are incompletely fused after heating.

In view of the foregoing, facile utilization of copper nanoparticles having nanoparticle sizes of less than about 20 nm would be of substantial benefit in the art. The present invention satisfies this need and provides related advantages as well.

SUMMARY

In various embodiments, articles containing a matrix material and a plurality of copper nanoparticles in the matrix material are described herein. The copper nanoparticles are at least partially fused together and are less than about 20 nm in size.

In other various embodiments, compositions of the present disclosure include a plurality of copper nanoparticles that are less than about 20 nm in size and further contain a surfactant system having a bidentate diamine and one or more C6-C18 alkylamines, and a matrix material selected from the group consisting of a polymer matrix, a rubber matrix, a ceramic matrix, a metal matrix, and a glass matrix.

In various embodiments, methods of the present disclosure include providing a plurality of copper nanoparticles that are less than about 20 nm in size, mixing the plurality of copper nanoparticles with a matrix material, and applying at least one of heat or pressure to at least partially fuse the plurality of copper nanoparticles together.

In other various embodiments, methods of the present disclosure include providing an article containing a matrix material and a plurality of copper nanoparticles that have been at least partially fused together in the matrix material, and placing the article in thermal contact with a heat source. The plurality of copper nanoparticles are less than about 20 nm in size.

In still other various embodiments, methods of the present disclosure include providing a plurality of copper nanoparticles that are mixed with a matrix material to form a paste, placing the paste in a joint between a first member and a second member, and joining the first member to the second member by at least partially fusing the plurality of copper nanoparticles together. The plurality of copper nanoparticles are less than about 20 nm in size and further contain a surfactant system having a bidentate diamine and one or more C6-C18 alkylamines.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing a specific embodiments of the disclosure, wherein.

DETAILED DESCRIPTION

Figure 1:
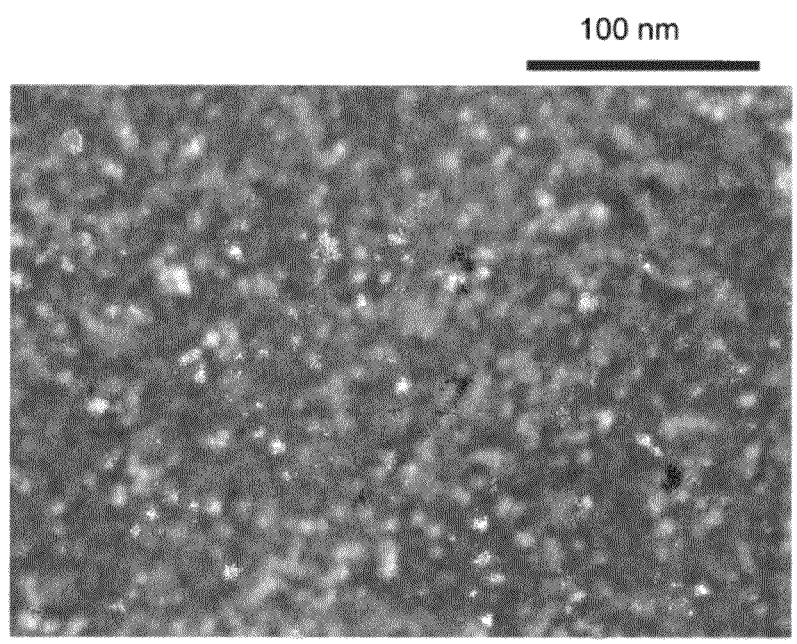
FIG. 1 shows an illustrative SEM image of copper nanoparticles.

The present disclosure is directed, in part, to articles containing a matrix material and a plurality of copper nanoparticles that have been at least partially fused together, where the copper nanoparticles are less than about 20 nm in size. The copper nanoparticles are operable to become at least partially fused together by applying pressure and/or gentle heating (e.g., <~200° C.). The conditions under which the copper nanoparticles become at least partially fused together generally do not deform or otherwise damage the articles in which the copper nanoparticles reside. In fact, the copper nanoparticles can become at least partially fused together during formation of the article (e.g., during polymer curing, during extrusion, or during press molding of a green material containing copper nanoparticles). Furthermore, the matrix material lengthens the shelf life of the copper nanoparticles and improves their stability against oxidation. Still further, upon becoming at least partially fused together, the copper nanoparticles can form an electrically or thermally conductive percolation pathway in the matrix material. This feature can allow an initially non-conductive matrix material to become electrically or thermally conductive.

The present disclosure is also directed, in part, to methods for at least partially fusing copper nanoparticles together in a matrix material. These methods can further be used to facilitate thermal transport in a matrix material and to join a first member and a second member together. In addition, fusible compositions containing a plurality of copper nanoparticles and a matrix material are described herein.

In addition to the foregoing, it is believed that copper nanoparticles can be used in various catalytic processes in which bulk copper catalysts can be used. Such chemical processes can include, for example, the water-gas shift reaction and cross-coupling reactions (e.g., Glaser couplings, Suzuki-Miyaura couplings of boronates and vinyl or aryl halides and Ullmann couplings). Copper catalysts are also of particular importance in the formation of silicones, where there is an ongoing search for new copper catalysts that can produce different types of materials in higher yield and purity. Further, copper nanoparticles can display useful optical and electrical properties. As such, they have potential uses in microelectromechanical and nanoelectromechanical devices, biomaterials, biomarkers, diagnostic imaging devices, sensors, coatings, composite materials, textiles, fuel cells, and solar cells. Still further, they can have potential applications in anti-microbial and anti-fungal compositions. Any of these applications can benefit from placing the copper nanoparticles in a matrix material, which functions as a solid support.

As used herein, the term "size range" refers to the distribution of nanoparticle sizes in a plurality of nanoparticles such that >95% of the nanoparticles have a size residing within the indicated size range.

As used herein, the term "average size" refers to the arithmetic mean of the distribution of nanoparticle sizes in a plurality of nanoparticles.

As used herein, the term "maximum size" refers to the largest nanoparticle size observed in a plurality of nanoparticles.

As used herein, the terms "fuse," "fused" or "fusion" refer to a coalescence or partial coalescence between two or more nanoparticles. In the coalescence or partial coalescence of two or more nanoparticles there is necking and formation of a bond between the two or more nanoparticles. At or above the fusion temperature, the atoms on the surface region of the nanoparticle behave as if that part of the nanoparticle were in the liquid state.

As used herein, the term "fusion temperature" refers to the temperature at which a nanoparticle liquefies, giving the appearance of melting.

As used herein, the term "copper salt" refers to any salt of copper in any of its common oxidations states, including cuprous salts, i.e., Cu(I), and cupric salts, i.e., Cu(II).

As used herein, the term "organic solvent" generally refers to polar aprotic organic solvents. Useful organic solvents of the embodiments described herein are capable of solubilizing copper salts and reducing agents or acting as co-solvents to solubilize copper salts and reducing agents.

In various embodiments, articles containing a matrix material and a plurality of copper nanoparticles in the matrix material are described herein. The copper nanoparticles are at least partially fused together and are less than about 20 nm in size.

In some embodiments, the plurality of copper nanoparticles can further contain a surfactant system. Without being bound by theory or mechanism, it is believed that the surfactant system helps stabilize the copper nanoparticles after their formation and inhibits their agglomeration back into bulk copper. Surfactant systems suitable for synthesizing copper nanoparticles are described in co-pending U.S. patent application Ser. No. 12/512,315, filed Jun. 30, 2009, and Ser. No. 12/813,463, filed Jun. 10, 2010, each of which is incorporated herein by reference in its entirety.

In some embodiments, the surfactant systems include, for example, amine compounds or mixtures of amine compounds with a chelating agent. In some embodiments, the chelating agent is a bidentate diamine. In some embodiments, the bidentate diamine has secondary and/or tertiary terminal amino groups. In some embodiments, secondary or tertiary terminal amino groups can be present in combination with a primary amine in a bidentate diamine. Illustrative bidentate diamine chelating agents include, for example, ethylenediamine and derivatives thereof (e.g., N,N'-dimethylethylenediamine, N,N'-diethylethylenediamine, and N,N'-di-tert-butylethylenediamine). Other illustrative bidentate diamine chelating agents can include, for example, methylenediamine, 1,3-propylenediamine and like derivatives thereof. In other embodiments, multi-dentate amine chelating agents can be used. Illustrative multi-dentate chelating agents can include, for example, diethylenetriamine, triethylenetetramine and tetraethylenepentamine. Other examples of chelating agents that can be useful for preparing copper nanoparticles include, for example, ethylenediaminetetraacetic acid and derivatives thereof, and phosphonates In some embodiments, the surfactant system remains in the matrix material of the present articles following at least partial fusion of the copper nanoparticles. In other embodiments, the surfactant system remains associated with the copper nanoparticles following their at least partial fusion. In still other embodiments, the surfactant system is partially or completely removed from the present articles following at least partial fusion of the copper nanoparticles. One of ordinary skill in the art will recognize that the physical and chemical properties of the components of the surfactant system will determine its ultimate disposition in the present articles.

In some embodiments, the surfactant system contains a bidentate diamine and one or more C6-C18 alkylamines, where C6-C18 refers to the number of carbons in the alkyl group. In some embodiments, the bidentate diamine is a C1-C4 N,N'-dialkylethylenediamine, a C1-C4 N,N'-dialkylmethylenediamine or a C1-C4 N,N'-dialkyl-1,3-propylenediamine, where C1-C4 refers to the number of carbons in the alkyl groups. In such embodiments, the alkyl groups can be the same or different. Such surfactant systems can be operable to produce copper nanoparticles having a nanoparticle size of less than about 10 nm under mild heating conditions (e.g., 30-80° C.) using inexpensive copper salts, reducing agents and solvents, according to the embodiments described herein. As described herein, the size range of the copper nanoparticles can be tuned by adjusting, for example, the reaction temperature, the reagent concentrations, and/or the reagent addition rate. For example, in some embodiments, heating conditions between about 30° C. to about 50° C. can be used to control the size range copper nanoparticles produced.

In some embodiments, the surfactant system used for synthesizing copper nanoparticles contains an N,N'-dialkylethylenediamine. In some embodiment, the surfactant system contains a C1-C4 N,N'-dialkylethylenediamine, a C1-C4 N,N'-dialkylmethylenediamine or a C1-C4 N,N'-dialkyl-1,3-propylenediamine. Without being bound by theory or mechanism, it is believed that such diamine compounds function as bidentate ligands that can effectively chelate copper ions at the two nitrogen atoms and stabilize the formation of small diameter copper nanoparticles. In some embodiments, the alkyl groups of the C1-C4 N,N'-dialkylethylenediamine, C1-C4 N,N'-dialkylmethylenediamine or C1-C4 N,N'-dialkyl-1,3-propylenediamine are the same, while in other embodiments they are different. The C1-C4 alkyl groups include methyl, ethyl, propyl, and butyl groups, including normal chain or branched alkyl groups such as, for example, isopropyl, isobutyl, sec-butyl, and tert-butyl groups. Other bidentate, tridentate, and polydentate ligands can also be employed in the surfactant system in alternative embodiments. In general, the bidentate, tridentate or polydentate ligands of the surfactant system are present in an amount ranging from about 12 percent to about 16 percent by volume of the reaction mixture used for synthesizing copper nanoparticles, after addition of all reagents thereto. However, concentrations outside this range can also be used, if desired.

In some embodiments, the surfactant system also includes one or more C6-C18 alkylamines. In some embodiments, the surfactant system includes a C7-C10 alkylamine. In other embodiments, the surfactant system includes a C11 or C12 alkylamine. In alternative embodiments, a C5 or C6 alkylamine can be used instead of a C6-C18 alkylamine. One of ordinary skill in the art will recognize that the size of the alkyl group in the alkylamine needs to be long enough to effectively form inverse micelles in the reaction mixture used for synthesizing copper nanoparticles, while maintaining sufficient volatility and being easily handled. For example, alkylamines having more than 18 carbons can also be used to synthesize copper nanoparticles in alternative embodiments of the present disclosure, but they can be more difficult to handle because of their waxy character. In contrast, C7-C10 alkylamines provide a good balance of desired properties and easy use. In some embodiments, a C6-C18 alkylamine can be n-heptylamine. In other embodiments, a C6-C18 alkylamine can be n-octylamine. In still other embodiments a C6-C18 alkylamine can be n-nonylamine or n-decylamine. While these are all straight chain amines, one of ordinary skill in the art will appreciate that branched chain C6-C18 alkylamines (e.g., 7-methyloctylamine and like branched chain alkylamines) can also be used.

Without being bound by theory or mechanism, monoalkylamines such as C6-C18 alkylamines also serve as ligands in the coordination sphere of copper ions, according to the various embodiments described herein. Unlike the bidentate diamines described above, however, the monoalkylamines more readily dissociate from the copper ions due to their single point of ligation.

In general, the one or more C6-C18 alkylamines are present in an amount ranging from about 10 percent to about 15 percent by volume of the reaction mixture used for synthesizing copper nanoparticles, after addition of all reagents thereto. However, alkylamine concentrations outside this range can also be used for synthesizing copper nanoparticles. Moreover, in some embodiments, the volume ratio of the bidentate, tridentate or polydentate ligand to the C6-C18 alkylamine ranges between about 1:1 to about 2:1.

In some embodiments, methods for synthesizing copper nanoparticles using a surfactant system that contains a C1-C4 N,N'-dialkylethylenediamine and a C6-C18 alkylamine includes at least the following operations: 1) heating a copper salt solution that contains a copper salt, an C1-C4 N,N'-dialkylethylenediamine and a C6-C18 alkylamine in an organic solvent to a temperature between about 30° C. and about 80° C.; 2) heating a reducing agent solution containing a reducing agent, an N,N'-dialkylethylenediamine and a C6-C18 alkylamine in an organic solvent to a temperature between about 30° C. and about 80° C.; and 3) rapidly adding the heated copper salt solution to the heated reducing agent solution, thereby resulting in the production of copper nanoparticles. In some embodiments, heating can be conducted between about 30° C. and about 45° C. or between about 30° C. and about 50° C. to better control the size range of the copper nanoparticles. In some embodiments, the heated reducing agent solution can be rapidly added to the heated copper salt solution to result in the production of copper nanoparticles.

In some embodiments, the copper nanoparticles can be used in situ without further isolation. In other embodiments, various workup procedures can be performed to isolate and purify the copper nanoparticles. In some embodiments, these workup procedures can include, for example, rinses, sonication, centrifugation, repetitions thereof and combinations thereof.

In carrying out the synthesis of copper nanoparticles according to the present embodiments, the heating of the copper salt solution and the reducing agent solution avoids uneven temperatures on mixing and allows for rapid addition of the two solutions. In some embodiments, rapid addition means an addition that is completed in less than about 5 minutes. In some embodiments, rapid addition means an addition that is completed in less than about 4 minutes, in less than about 3 minutes in other embodiments, in less than about 2 minutes in still other embodiments, and in less than about 1 minute in still other embodiments.

In some embodiments, methods for synthesizing copper nanoparticles utilize copper (I) and/or copper (II) salts. Illustrative copper salts include, for example, copper halides, copper nitrate, copper acetate, copper sulfate, copper formate, and copper oxide. One of ordinary skill in the art will recognize the benefit of choosing a copper salt that has good solubility in the organic solvent being employed. Moreover, the choice of copper salt can be a function of cost and scale. For example, inexpensive copper halide salts can be especially effective for large scale operations. Particularly, in some embodiments, the copper salt can be a copper halide selected from copper chloride, copper bromide, or copper iodide.

In general, a wide variety of reducing agents can be used in the present methods for synthesizing copper nanoparticles. Suitable reducing agents are those that are compatible with the solvent being used and can reduce copper (II) to copper (0), copper (I), or mixtures thereof. In some embodiments, the reducing agent is a hydride-based reducing agent such as, for example, sodium borohydride. One of ordinary skill in the art will recognize that when employing a hydride-based reducing agent, the hydride source will provide the requisite change in copper oxidation state. Although it is possible that copper hydrides initially form in some embodiments, they are believed to decompose rapidly to form copper (0).

In some embodiments, synthesis of copper nanoparticles is carried out in an organic solvent. The organic solvent can be substantially anhydrous in some embodiments. In some embodiments, the organic solvent can be a polar aprotic organic solvent that is capable of at least partially solubilizing the copper salt and the reducing agent. Illustrative polar aprotic organic solvents include, for example, N,N-dimethylformamide, dimethyl sulfoxide, dimethylpropylene urea, hexamethylphosphoramide, glyme, diglyme, triglyme, tetraglyme, tetrahydrofuran, 1,4-dioxane, and 2,3-dimethoxy-1,4-dioxane. In some embodiments, the organic solvent is triglyme. This organic solvent provides good solubility for copper chloride and simultaneously activates sodium borohydride to function as a reducing agent. In some embodiments, the presence of the surfactant system in the organic solvent can also assist in dissolution of the copper salt through the formation of a copper-organic ligand complex. In addition, co-solvents can be used to assist the dissolution of the copper salt and/or the reducing agent.

The sizes of the copper nanoparticles synthesized by the above methods can be sensitive to the temperature at which the reaction is conducted. In various embodiments, the sizes of the copper nanoparticles can range substantially between about 1 nm and about 10 nm. When the reaction temperature ranges between about 30° C. and about 45° C. or between about 30° C. and about 50° C., the copper nanoparticles can generally range between about 1 nm and about 5 nm in size. However, when the reaction temperature ranges between about 45° C. and about 50° C. or between about 50° C. and about 65° C., the copper nanoparticles can generally range between about 5 nm and about 10 nm in size. Copper nanoparticles having other size ranges can be obtained through routine experimentation.

Without being bound by theory or mechanism, it is believed that the temperature control over these narrow ranges is facilitated by separate heating of the copper salt solution and the reducing agent solution prior to mixing, thereby providing the resultant narrow distribution of copper nanoparticle sizes. In some embodiments, copper nanoparticles synthesized by the present methods range between about 1 nm and about 10 nm in size. In other embodiments, the copper nanoparticles range from about 1 nm to about 5 nm in size, or from about 2 nm to about 5 nm in size, or from 3 nm to about 5 nm in size. In still other embodiments, the copper nanoparticles range between about 5 nm and about 10 nm in size. In general, the copper nanoparticles have a substantially spherical shape. In some embodiments, copper nanoparticles that are less than about 20 nm in size can be produced.

As noted above, the fusion temperature can be a function of the size of the copper nanoparticles, with smaller copper nanoparticles having lower fusion temperatures. In some embodiments, the fusion temperature of the copper nanoparticles ranges between about 100° C. and about 200° C. In other embodiments, the fusion temperature of the copper nanoparticles is less than about 100° C.

Unless otherwise noted, the fusion temperatures given herein are those observed in the absence of an externally applied pressure (other than atmospheric pressure). However, the fusion temperature is also a function of applied pressure, with the fusion temperature decreasing at higher pressures. In some embodiments, sufficient pressure to induce at least partial fusion of the copper nanoparticles can be imparted by processes such as ink jet printing, extrusion or centrifugation. For example, substantial fusion of copper nanoparticles at room temperature can occur at a pressure of as little as ~3.9 atmospheres after centrifugation for 20-30 minutes, thereby producing micron size copper crystals. Controlling the amount and duration of the applied pressure also allows modulation of the degree of fusion of the copper nanoparticles. For example, application of 2000 psi static pressure to copper nanoparticles produced 25% uniform porosity at 300° C. (more fusion) and a higher uniform porosity of 37% at 160° C. (less fusion). In sum, both the size of the copper nanoparticles and the pressure applied thereto can be used to modulate the fusion temperature to a desired level.

In addition to the methods described above, copper nanoparticles can also be synthesized by other methods known to those of ordinary skill in the art. For example, copper nanoparticles having an average size of about 3.4 nm can be prepared via ascorbic acid-mediated reduction. Such a copper nanoparticle synthesis is described in Wu, et al., "Simple One-Step Synthesis of Uniform Disperse Copper Nanoparticles," Mater. Res. Soc. Symp. Proc., 879E:2005, pp. Z6.3.1-Z6.3.6. However, these copper nanoparticles lack the surfactant system referenced above. Instead, the copper nanoparticles synthesized by this method are coated with polyvinylpyrrolidone, which is much less easily removed than the present surfactant system.

In some embodiments, articles of the present disclosure contain copper nanoparticles that range between about 1 nm and about 10 nm in size. In other embodiments, articles of the present disclosure contain copper nanoparticles that range between about 1 nm and about 5 nm in size or between about 5 nm and about 10 nm in size. In still other embodiments, articles of the present disclosure contain copper nanoparticles that range between about 1 nm and about 20 nm in size. As noted above, control over the size range of the copper nanoparticles can be modified through varying the reaction temperature, among other reaction parameters. In some embodiments, the size distribution of the copper nanoparticles is a narrow (e.g., ±about 1 nm) distribution. In other embodiments, the size distribution of the copper nanoparticles is a broader distribution (e.g., ±about 2 nm to 4 nm or even greater). One of ordinary skill in the art will recognize that a narrow distribution and a wide distribution can have the same average nanoparticle size, if the arithmetic means of the nanoparticle size distributions are the same. In some embodiments, the copper nanoparticles have a substantially Gaussian nanoparticle size distribution. In other embodiments, the copper nanoparticles have a nanoparticle size distribution that is non-Gaussian in nature.

In various embodiments, articles of the present disclosure contain copper nanoparticles that are at least partially fused together. As used herein, a copper nanoparticle that is partially fused to other copper nanoparticles retains at least some of its original shape following fusion. At a minimum, substantially spherical copper nanoparticles that are at least partially fused together are at least tangential to one another. For example, two substantially spherical copper nanoparticles that are partially fused together can have a dumbbell or figure 8 shape. At greater degrees of nanoparticle fusion, the partially fused nanoparticles can acquire a shape that does not resemble that of the original nanoparticles. For example, at greater degrees of nanoparticle fusion, two substantially spherical nanoparticles can acquire an ellipsoid shape. In alternative embodiments, a plurality of copper nanoparticles that are at least partially fused together can have at least some copper nanoparticles that are not fused with other copper nanoparticles.

In other embodiments, articles of the present disclosure can contain copper nanoparticles that have been completely or substantially fused together. That is, the copper nanoparticles do not retain any of their original nanoparticle shape after being fused.

Copper nanoparticles offer a unique way of infiltrating the matrix material of an article with copper. In some embodiments, the at least partially fused copper nanoparticles form an electrically or thermally conductive percolation pathway in the present articles. In some embodiments, the at least partially fused copper nanoparticles are present in the matrix material in the form of a film or a layer within the article. In some embodiments, the entire article contains the at least partially fused copper nanoparticles. In other embodiments, only a portion of the article contains the at least partially fused copper nanoparticles.

Whether the copper nanoparticles become partially or completely fused together in the matrix material depends, inter alia, on the temperatures and/or pressures to which the copper nanoparticles are exposed and the exposure time. As noted above, the present disclosure advantageously describes articles containing copper nanoparticles of a size such that their fusion temperature is less than about 200° C., again depending on the temperature and/or pressure applied thereto. In some embodiments, the article is heated at a temperature of less than about 200° C. in order to at least partially fuse the copper nanoparticles. In other embodiments, the article is heated at a temperature of less than about 100° C. in order to at least partially fuse the copper nanoparticles. These fusion temperatures are much lower than that of bulk copper or even larger nanoparticles, thereby allowing the infusion of copper into articles that would not withstand the temperatures required to melt bulk copper.

One of ordinary skill in the art will further recognize that whether the copper nanoparticles are partially or completely fused together in the present articles can also depend, at least to some degree, on the concentration of copper nanoparticles contained within the matrix material. For example, at lower copper nanoparticle concentrations, the copper nanoparticles can be more well dispersed from one another, thereby leading to a lower likelihood of coalescence upon heating and/or applying pressure. However, at higher nanoparticle concentrations, application of heat and/or pressure can lead to at least partial coalescence between the copper nanoparticles simply by their being in close contact with one another prior to fusion.

Further, the strength of the interaction (i.e., bond strength) between the copper nanoparticles can be controlled by varying the degree of copper nanoparticle fusion. For example, the bond strength at the interface between the copper nanoparticles is very strong, approaching that of bulk copper, when the degree of fusion is complete or very nearly complete. In an embodiment, such strong bonding can occur when the copper nanoparticles fuse together to form a thermally conductive percolation pathway. In contrast, when the degree of nanoparticle fusion is less than complete (i.e., partial fusion), the bond strength at the interface between the copper nanoparticles is weaker. By way of non-limiting example, weaker bonding between the copper nanoparticles can be desirable when the copper nanoparticles are distributed in an epoxy matrix. By way of further non-limiting example, an article containing about 20% copper nanoparticles by weight in a flexible polymer (e.g., a rubber or silicone polymer) can maintain at least some degree of flexibility. However, if the amount of copper nanoparticles is increased to about 80% by weight or even higher, the article can become substantially rigid, particularly after copper nanoparticle fusion In some embodiments, articles of the present disclosure further include a filler material. Illustrative filler materials include, without limitation, flame retardants, UV protective agents, antioxidants, graphite, graphite oxide, graphene, carbon nanotubes, fiber materials (e.g., carbon fibers, glass fibers, metal fibers, ceramic fibers and organic fibers) and ceramic materials (e.g., silicon carbide, boron carbide, boron nitride, and the like). In some embodiments, the filler material is also in the nanoparticle size range.

UV protective agents that can be used as filler materials in the present embodiments include, for example, organic, organometallic and inorganic compounds that absorb light between about 200 and about 400 nm (e.g., near- and middle ultraviolet light). Illustrative UV protective agents include, for example, titanium dioxide, zinc oxide, stilbene and substituted stilbenes (e.g., TINOPAL LPW available from Ciba-Geigy Corp.), MEXORYL SX (ecamsule) which is a benzylidene camphor derivative available from L'Oréal, oxybenzone, and avobenzone.

Antioxidants that can be used as filler materials in the present embodiments include, for example, ascorbic acid, butylated hydroxyanisole, butylated hydroxytoluene (BHT), gallate esters including propyl gallate, and α-tocopherol.

In various embodiments, matrix materials suitable for use in the present articles can be polymer matrices, including rubber matrices. In some embodiments, the polymer matrices are thermoplastic polymer matrices, thermosetting polymer matrices (i.e., epoxy matrices) or elastomeric polymer matrices (e.g., natural or synthetic rubbers). Illustrative polymer matrices that can be used in the present embodiments include, for example, polycarbonates, cyanoacrylates, silicone polymers, polyurethanes, natural and synthetic rubbers, derivatives thereof and the like. In some embodiments, the copper nanoparticles are distributed in a two-component epoxy precursor system which is then cured. In other embodiments, the copper nanoparticles are distributed in a softened thermoplastic or elastomeric matrix, which is thereafter cooled and hardened to encapsulate the copper nanoparticles therein.

In some embodiments, the matrix material can be a silsesquioxane such as, for example, POSS (Polyhedral Oligomeric Silsesquioxane), which is commercially available from Reade Advanced Materials and has the following structural formula.

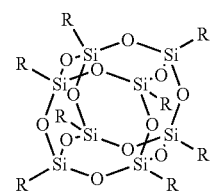

In the indicated structural formula, the R groups can be the same or different in various embodiments. In general, the R groups are alkyl groups, which can optionally contain further substitution. Illustrative examples of functional groups that can further substitute the R groups in POSS include, for example, thiols, sulfides, amines, amides, hydroxyl groups, and carboxylic acids.

In some embodiments, the matrix material is a phase change material, particularly a phase change polymer, that isothermally releases or absorbs heat upon changing state. Illustrative phase change materials suitable for use in the present embodiments include, for example, paraffins (e.g., compounds having a formula $C_nH_{2n+2}$, where n is an integer) and fatty acids (e.g., compounds having a formula $CH_3(CH_2)_{2n}CO_2H$, where n is an integer).

In alternative embodiments, the matrix material can be a material such as, for example, ceramic materials, glasses and metals. For example, siloxanes and alumoxanes can be used as matrix materials. Copper nanoparticles can be particularly useful in polymeric, glass and ceramic matrix materials, since at least partially fused nanoparticles can form an electrically or thermally conductive percolation pathway in these normally non-conductive materials.

In some embodiments, the matrix material (e.g., a polymer matrix, a rubber matrix, a glass matrix, a ceramic matrix or a metal matrix) serves not only as a continuous phase to support the copper nanoparticles, but it also protects the copper nanoparticles from oxidation. Particularly after being at least partially fused, copper nanoparticles can be especially susceptible to oxidation. The matrix material can shield the at least partially fused copper nanoparticles from an oxidizing environment, thereby slowing or substantially stopping various oxidation processes by filling voids between the copper nanoparticles.

In some embodiments, the matrix material of the present articles is removable. Thus, in some embodiments, the matrix material of the present articles can be removed to leave behind a network of at least partially fused copper nanoparticles. Depending on the degree of nanoparticle fusion and the concentration of copper nanoparticles initially present in the matrix material, the network that remains behind can be a continuous, essentially non-porous copper network or a copper network having at least some degree of porosity.

In general, copper nanoparticles are present in the articles described herein in an amount ranging between about 10% and about 99.9% of the article by weight. In some embodiments, the copper nanoparticles are present in an amount ranging between about 10% and about 50% by weight or, in other embodiments, in an amount ranging between about 20% and about 60% by weight, or, in other embodiments, in an amount ranging between about 25% and about 50% by weight. In some embodiments, the copper nanoparticles are present in an amount ranging between about 70% and about 99.9% of the article by weight. In other embodiments, the copper nanoparticles are present in an amount ranging between about 80% and about 99% of the article by weight or, in still other embodiments, between about 90% and about 99% of the article by weight.

In some embodiments, the plurality of copper nanoparticles form a thermally conductive percolation pathway in the matrix material of the present articles. Such a thermally conductive percolation pathway can be formed from partially fused copper nanoparticles or completely fused copper nanoparticles. In forming a thermally conductive percolation pathway using at least partially fused copper nanoparticles, articles having much higher thermal conductivities can be formed than when using bulk copper. For example, in some embodiments, articles of the present disclosure that contain at least partially fused copper nanoparticles have thermal conductivities ranging between about 50 watts/m·K and about 400 watts/m·K. In contrast, like articles containing micron size bulk copper particles typically have thermal conductivities in the range of about 5 watts/m·K to about 7 watts/m·K.

Due to their high thermal conductivities, the articles of the present disclosure can serve as a thermal interface material. An illustrative but non-limiting use of the present articles in this capacity is as a heat transfer medium in thermal contact with a heat source and a heat sink. In particular, the present articles can be especially useful for facilitating heat transfer from the central processing unit (CPU) of computers and like electronic devices. The CPUs of modern computers and like electronic devices put off significant quantities of heat, but the heat transference to the thermal ground plane or a heat dissipating device such as a fan, for example, is typically poor. As a result, active cooling measures are often utilized. By serving as a thermal interface material in contact with a heat source and a heat sink, articles of the present disclosure can overcome the heat transfer issues present in computers and other devices requiring transfer of excess heat. In some embodiments, the heat sink with which the present articles are in thermal contact can be a source of cooling water, refrigeration, a fan, a radiator or like heat dispersal medium that is separate from the articles. In some embodiments, the present articles can be constructed such that they dissipate excess heat themselves by having cooling vanes, coolant circulation pathways and the like. Stated another way, the present articles can be constructed such that they both conduct excess heat away from a heat source and dissipate the excess heat to the atmosphere or other heat sink. In some embodiments, the articles suitable for transferring heat away from a heat source include an epoxy matrix containing copper nanoparticles that have been at least partially fused together. In some embodiments, the epoxy matrix of such articles can further include at least one of silver, aluminum, graphite, graphite oxide, graphene, carbon nanotubes, fiber materials (e.g., chopped carbon fibers) or boron nitride. These materials can further aid the heat transfer.

The thermal conductivities of the present articles can be controlled through modulation of the amount of copper nanoparticles contained therein, as discussed hereinafter. For applications taking advantage of copper's thermal conductivity, the present articles can contain between about 10% and about 100% of copper nanoparticles by weight. The lower end of this range will ultimately be determined to a large degree by the intended application and the degree of thermal conductivity required. As noted above, when the concentration of copper nanoparticles approaches 100% by weight, the nanoparticle interface approaches that of bulk copper, although the copper nanoparticle structure can also be maintained, at least to some degree, in some embodiments, if only partial fusion has taken place. Regardless of the copper nanoparticle concentration in the present articles, the thermal conductivities can be much higher than like articles containing micron size copper particles. For example, when the present articles contain between about 95% to about 100% copper nanoparticles by weight, the thermal conductivities can approach 400 watts/m·K. On the lower end of the above concentration range, an article that contains about 15% to about 25% copper nanoparticles by weight can have a thermal conductivity of about 50-100 watts/m·K. Thus, even at low copper nanoparticle concentrations, the thermal conductivities of the present articles are one to two orders of magnitude greater than that of typical thermal interface materials. At about 50% copper nanoparticles by weight, the present articles can have a thermal conductivity of about 200 watts/m·K.

In various embodiments, methods for using articles containing copper nanoparticles in heat transfer applications are contemplated herein. In various embodiments, the methods include providing an article containing a matrix material and a plurality of copper nanoparticles that have been at least partially fused together in the matrix material, and placing the article in thermal contact with a heat source. The plurality of copper nanoparticles are less than about 20 nm in size. In some embodiments, the methods further include placing the article in thermal contact with a heat sink. In some embodiments, the plurality of copper nanoparticles further include a surfactant system having a bidentate diamine (e.g., a C1-C4 N,N'-dialkylethylenediamine, a C1-C4 N,N'-dialkylmethylenediamine or a C1-C4 N,N'-dialkyl-1,3-propylenediamine) and one or more C6-C18 alkylamines. As noted above, use of other bidentate, tridentate, or polydentate ligands and alkylamines also lie within the spirit and scope of the present disclosure.

In some embodiments, the plurality of copper nanoparticles form a thermally conductive percolation pathway in the matrix material after being at least partially fused together. In some embodiments, the thermally conductive percolation pathway is such that the article has a thermal conductivity ranging between about 50 watts/m·K and about 400 watts/m·K. In some embodiments, the plurality of copper nanoparticles are substantially non-porous after being at least partially fused. In other embodiments, the plurality of copper nanoparticles maintain at least some degree of porosity after being at least partially fused.

In other various embodiments, methods for fusing copper nanoparticles in a matrix material are disclosed herein. In some embodiments, methods of the present disclosure include providing a plurality of copper nanoparticles that are less than about 20 nm in size, mixing the plurality of copper nanoparticles with a matrix material and applying at least one of heat or pressure to at least partially fuse the copper nanoparticles together. In some embodiments, the plurality of copper nanoparticles form a thermally conductive percolation pathway after being at least partially fused. In some embodiments, the plurality of copper nanoparticles are substantially non-porous after being at least partially fused. In other embodiments, the plurality of copper nanoparticles maintain at least some degree of porosity after being at least partially fused.

In some embodiments, the methods further include removing the matrix material to leave behind a network of at least partially fused copper nanoparticles. Removal of the matrix material can take place by any known method including, for example, melting, dissolving, pyrolyzing, vaporizing, chemically reacting, and the like. For example, in an embodiment, the matrix material can be dissolved in a medium in which the matrix material is soluble but the copper nanoparticles are substantially insoluble and/or substantially non-reactive in their at least partially fused state.

In some embodiments, the copper nanoparticles further include a surfactant system such as one of those described hereinabove. In some embodiments, the surfactant system includes a bidentate diamine (e.g., a C1-C4 dialkylethylenediamine, a C1-C4 N,N'-dialkylmethylenediamine or a C1-C4 N,N'-dialkyl-1,3-propylenediamine) and one or more C6-C18 alkylamines. As noted above, other bidentate, tridentate or polydentate ligands can also be used within the spirit and scope of the present disclosure. Likewise, alkylamines other than C6-C18 alkylamines can also be used in some embodiments.

In some embodiments of the present methods, the plurality of copper nanoparticles are between about 1 nm and about 10 nm in size. In other embodiments, the plurality of copper nanoparticles are between about 1 nm and about 5 nm in size or between about 5 nm and about 10 nm in size. In still other embodiments, the plurality of copper nanoparticles are between about 1 nm and about 20 nm in size. As noted above, the fusion temperature of the copper nanoparticles will also depend upon the applied pressure, in addition to the copper nanoparticle size. In some embodiments, the plurality of copper nanoparticles become at least partially fused together by heating at a temperature of at most about 200° C. In other embodiments, the plurality of copper nanoparticles become at least partially fused together by heating at a temperature of at most about 100° C. Fusion temperatures of less than about 200° C. can be particularly advantageous when thermally sensitive matrix materials are employed.

In some embodiments, extruding the matrix material and the copper nanoparticles can result in at least partially fusing the copper nanoparticles together. In this case, extrusion forces can exert sufficient pressure on the copper nanoparticles so as to facilitate their fusion during the extrusion process.

In some embodiments, methods of the present disclosure further include curing the matrix material. For example, the matrix material can be a two-component epoxy in some embodiments, which is cured into a thermoset epoxy matrix. As another non-limiting example, the matrix material can be a powder material that is sintered into a cured matrix material. Curing of the matrix material can take place concurrently with the fusion of the copper nanoparticles in some embodiments. Alternately, the matrix material can be cured prior to fusion of the copper nanoparticles or after the fusion of the copper nanoparticles.

In still other various embodiments, methods are described herein for using copper nanoparticles to join materials together. In various embodiments, the methods include providing a plurality of copper nanoparticles that are mixed with a matrix material to form a paste, placing the paste in a joint between a first member and a second member, and joining the first member to the second member by at least partially fusing the plurality of copper nanoparticles together. The plurality of copper nanoparticles are less than about 20 nm in size and further contain a surfactant system of a bidentate diamine and one or more C6-C18 alkylamines. As noted above other bidentate, tridentate or polydentate ligands and alkylamines also lie within the spirit and scope of the present disclosure.

Processes for joining materials together using copper nanoparticles contained in a matrix material are particularly beneficial in the art. Specifically, the present methods complement processes in which conventional tin- and lead-based soldering materials cannot be effectively used. Further, the present methods allow two members to be joined together at low temperatures that are generally not damaging to most structural members.

A further advantage of the present methods is that, unlike conventional soldering techniques, copper nanoparticle-based soldering materials of the present disclosure can be used to join two non-metallic members together or to join a non-metallic member to a metallic member. Like conventional soldering techniques, the present methods can also be used to join two metallic members together as well. Without being bound by theory or mechanism, it is believed that inclusion of the matrix material with the copper nanoparticles beneficially increases the compatibility of the soldering material with a wide variety of materials to achieve more effective joining and greatly increases thermal heat transfer compared to currently used solders.

In general, high concentrations of copper nanoparticles in a paste are used for joining two members together. In some embodiments, the paste contains about 50% or higher copper nanoparticles by weight. In some embodiments, the paste contains about 60% or higher copper nanoparticles by weight. In some embodiments, the paste contains about 70% or higher copper nanoparticles by weight. In some embodiments, the paste contains about 80% or higher copper nanoparticles by weight. In some embodiments, the paste contains about 90% or higher copper nanoparticles by weight.

In applications for joining two members together, the plurality of copper nanoparticles can again be substantially non-porous or maintain at least some degree of porosity after being at least partially fused. In applications for joining two members together, maintaining at least some degree of porosity can allow for rework of the joint to take place after joining the first member to the second member. Rework can allow replacement of a failed component from the joint, for example. In copper nanoparticle-based soldering applications not utilizing a matrix material, maintaining porosity sufficient for rework can ultimately be detrimental due to rapid copper nanoparticle oxidation, in addition to requiring much higher rework temperatures. However, inclusion of the matrix material in the present embodiments beneficially protects the copper nanoparticles from oxidation while maintaining sufficient porosity to allow for rework. In some embodiments, the plurality of copper nanoparticles are up to about 25% porous after being at least partially fused together. In such embodiments, the copper nanoparticles can maintain a sufficient tensile strength to maintain the first member and the second member in a joined state. In some embodiments, a strength to failure joining the first member to the second member is at least about 4400 psi.

In various embodiments, the present disclosure describes compositions including a plurality of copper nanoparticles that are less than about 20 nm in size and further contain a surfactant system having a bidentate diamine and one or more C6-C18 alkylamines, and a matrix material selected from the group consisting of a polymer matrix, a rubber matrix, a ceramic matrix, a metal matrix, and a glass matrix. Such compositions can be used in various applications described herein including, for example, forming articles and joining a first member to a second member.

It is understood that modifications which do not substantially affect the activity of the various embodiments of this invention are also included within the definition of the invention provided herein. Accordingly, the following Examples are intended to illustrate but not limit the present invention.

EXPERIMENTAL EXAMPLES

Example 1

Synthesis and Characterization of Copper Nanoparticles 0.8 g of copper (II) chloride dihydrate was placed into a 250 mL 3 neck round bottom flask, evacuated and back-filled with argon three times. A plastic syringe and a stainless steel needle were used to add the following surfactants and organic solvents in the order given and under positive argon pressure: 4 mL of N,N'-di-tert-butylethylenediamine, 4 mL n-nonylamine and 45 mL degassed triglyme. The color of the solution turned dark blue. The copper salt solution was then stirred and heated for 2 hours at 45° C.

A second 250 mL 3 neck round bottom flask was charged with 8 mL of dry 2.0 M sodium borohydride solution in triglyme. A plastic syringe and a stainless steel needle were used to add the following surfactants in the order given and under positive argon pressure: 4 mL of n-nonylamine and 6 mL of N,N'-di-tert-butylethylenediamine. The resulting solution was colorless. The reducing agent solution was heated to 45° C. and stirred for 1 hour, during which time the solution turned slightly cloudy.

While keeping both flasks at 40° C., the copper (II) chloride solution was transferred to the flask containing the sodium borohydride reducing agent over a period of five minutes using a cannula. When the transfer was complete, the reaction mixture was dark purple. In the 10 minutes after transfer, the reaction mixture turned cloudy and stayed white for about 4 minutes. Subsequently, the reaction mixture kept changing color from white, to yellow-brown and eventually dark brown over the next five minutes. At this point, the reaction mixture was cooled to −10° C. in a dry ice/acetone bath for 10 minutes.

After cooling, the reaction mixture was centrifuged at 2000-3000 RPM for 20 minutes, which resulted in a dark brown precipitate and a clear supernatant. The black precipitate was mixed with a solution of degassed hexane (80 mL) and dicyclohexylamine (10 mL), which was then sonicated for 10 minutes. The new mixture was centrifuged at 2000-3000 RPM for 10 minutes, and a black precipitate and clear supernatant were obtained. The black precipitate was mixed with a solution of degassed toluene (80 mL) and dicyclohexylamine (10 mL), which was then sonicated and centrifuged at 2000-3000 RPM for 10 minutes. A black precipitate and a clear supernatant were obtained. In the next step, 40 mL of degassed deionized water was added to the black precipitate as well as 40 mL toluene and 5 mL dicyclohexylamine. The mixture was shaken and sonicated for 10 minutes. The addition of the deionized water caused some gas evolution and bubbling. Thereafter, the mixture was sonicated and centrifuged at 2000-3000 RPM for 20 minutes, which resulted in 3 layers: a dark brown organic (top layer), a second slightly cloudy aqueous layer (middle layer) and a small amount of a dark brown/copper color precipitate (bottom layer). The organic layer and the precipitate were isolated and stored in a glass vial under argon at −5° C.

Figure 2:
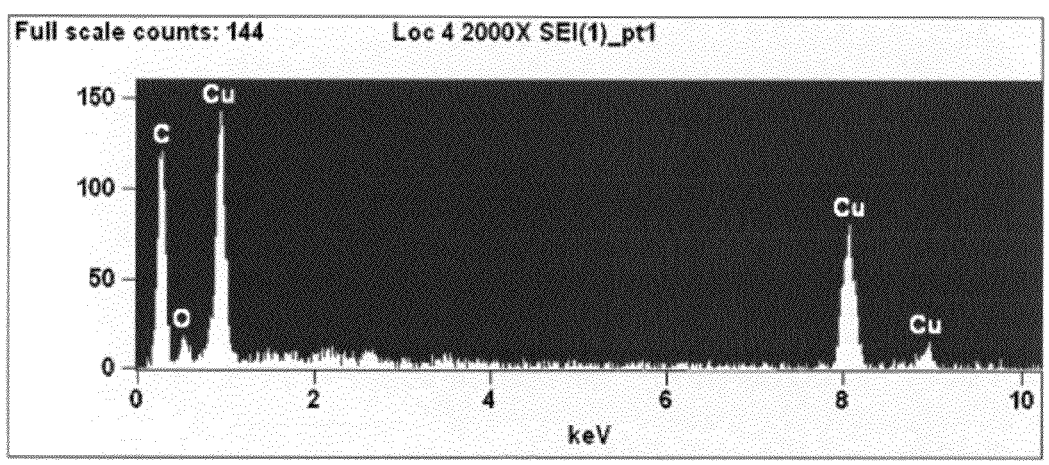
FIG. 2 shows an illustrative EDS spectrum of copper nanoparticles.

Scanning Electron Microscope Analysis: A JEOL JSM7001-FLV Scanning Electron Microscope (SEM) was employed in this analysis. FIG. 1 shows an illustrative SEM image of copper nanoparticles. Samples were prepared using a dilute organic solution and TEM grids (Cu/Au, carbon coated, 200/300 grid). The specified resolution was 1.2 nm at 30 kV and 3 nm at 1 kV, and the magnification range was from 20× to 1,000,000×. The SEM also offers a rapid chemical analysis using Energy Dispersive Spectroscopy (EDS). FIG. 2 shows an illustrative EDS spectrum of copper nanoparticles, which shows copper from the nanoparticles and carbon from the surfactant and/or solvent washes. The EDS also indicated a small quantity of oxygen, possibly from oxidation arising from surfactant removal in the SEM vacuum chamber.

Figure 3:
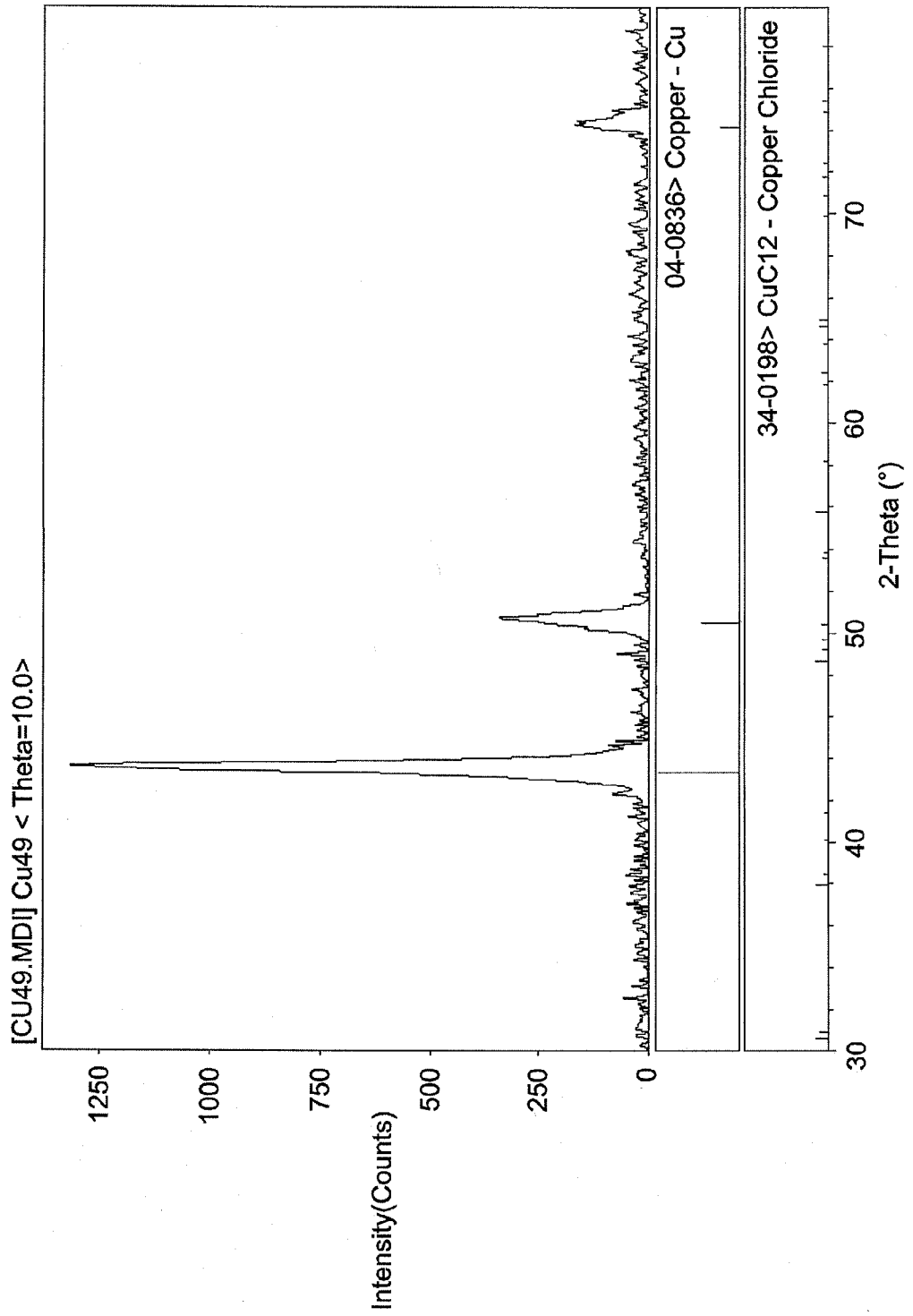
FIG. 3 shows an illustrative XRD spectrum of copper nanoparticles.

X-Ray Diffraction (XRD) Analysis: A Siemens D5000 Diffractometer was used for analysis. The dark precipitate of copper nanoparticles was isolated and dried in air on a watch glass. A double sided sticky tape (0.5 cm×1 cm) was placed in the center of a standard glass slide. The dark powder was placed on the tape and pressed down for good adhesion such that it covered the entire tape. The glass slide was placed in the XRD sample holder and the run conducted using the following conditions: Range 30°-80°, Step size: 0.1, Dwell time: 12, Deg: 5, Theta: 10°, Laser Voltage (kV) 40 and Current (mA) 30, run time 96 minutes. FIG. 3 shows an illustrative XRD spectrum of copper nanoparticles. The XRD spectrum indicated the presence of copper metal only, with no copper salt or copper oxide detected.

Example 2

Fusion of Copper Nanoparticles

Figure 4:
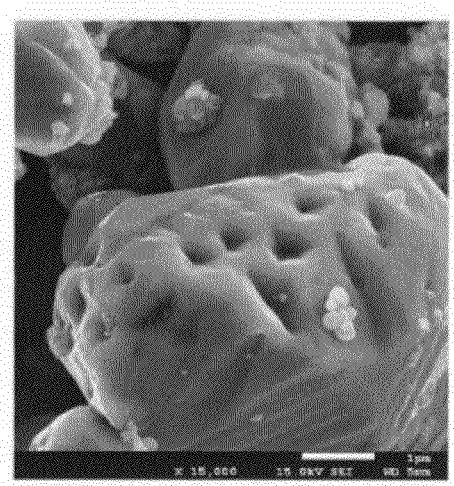
FIG. 4 shows an illustrative SEM image of a micron-size copper crystal formed by fusion of copper nanoparticles at room temperature during centrifugation.

Copper nanoparticles produced as above were centrifuged for 20-30 minutes at approximately 10,000 rpm such that a pressure of ~3.9 atmospheres was exerted on the copper nanoparticles. Under these conditions, formation of micron-size copper crystals was observed. FIG. 4 shows an illustrative SEM image of a micron-size copper crystal formed by fusion of copper nanoparticles at room temperature during centrifugation.

Figure 5A:
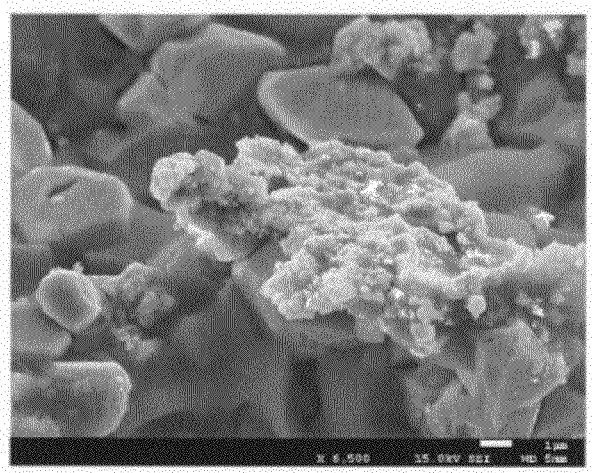
FIGS. 5A and 5B show illustrative SEM images of a network of substantially fused copper nanoparticles.
Figure 5B:
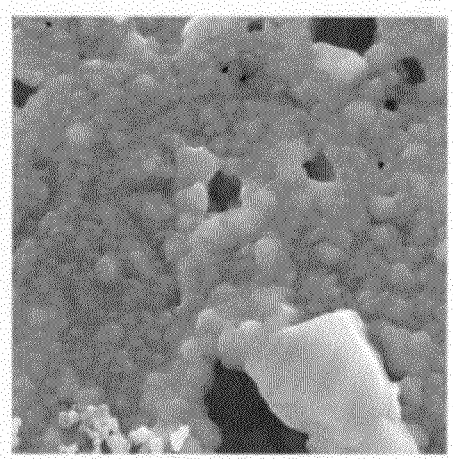
Figure 6:
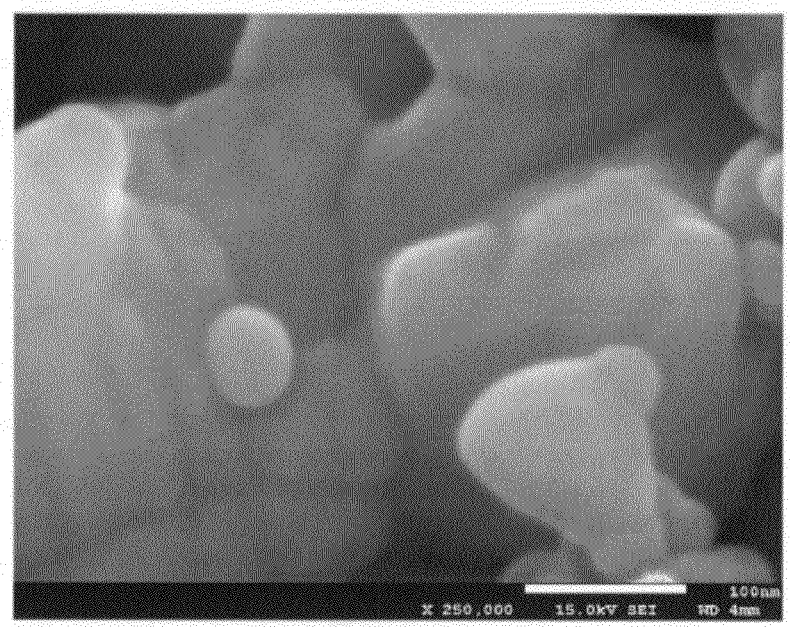
FIG. 6 shows an illustrative close up SEM image of partially fused copper nanoparticles, which demonstrates widespread necking of the individual nanoparticles.
Figure 7:
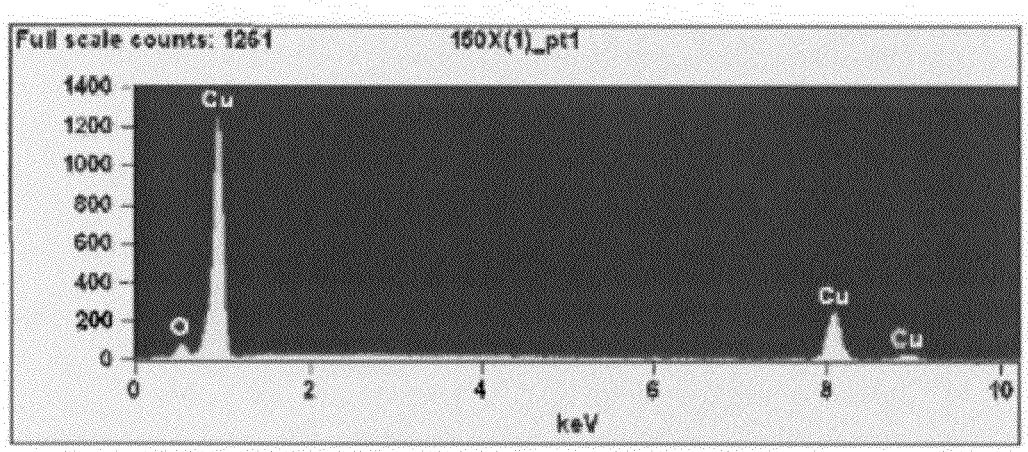
FIG. 7 shows an illustrative EDS spectrum of substantially fused copper nanoparticles.

Upon heating, application of pressure, and/or extrusion for a sufficient length of time, the copper nanoparticles can become substantially fused together. FIGS. 5A and 5B show illustrative SEM images of a network of substantially fused copper nanoparticles. FIG. 6 shows an illustrative close up SEM image of partially fused copper nanoparticles, which demonstrates widespread necking of the individual nanoparticles. FIG. 7 shows an illustrative EDS spectrum of substantially fused copper nanoparticles. In this case, carbon from the surfactant and/or solvent washes was not observed in the EDS spectrum.

Although the invention has been described with reference to the disclosed embodiments, those skilled in the art will readily appreciate that these only illustrative of the invention. It should be understood that various modifications can be made without departing from the spirit of the invention, which is defined by the following claims.

What is claimed is the following:

1. A method comprising:
    providing a plurality of copper nanoparticles that are mixed with a matrix material to form a paste;
        wherein the plurality of copper nanoparticles are less than about 20 nm in size and further comprise a surfactant system comprising a bidentate diamine and one or more C6-C18 alkylamines;
    placing the paste in a joint between a first member and a second member; and
    joining the first member to the second member by at least partially fusing the plurality of copper nanoparticles together;
        wherein the copper nanoparticles are present as a thermally conductive percolation pathway within the matrix material upon being at least partially fused together.

2. The method of claim 1, wherein the plurality of copper nanoparticles are sufficiently porous to allow for rework of the joint after being at least partially fused together.

3. The method of claim 2, wherein the plurality of copper nanoparticles are up to about 25% porous after being at least partially fused together.

4. The method of claim 1, wherein a strength to failure joining the first member and the second member is at least about 4400 psi.

5. The method of claim 1, wherein the matrix material is selected from the group consisting of a polymer matrix, a rubber matrix, a glass matrix, a ceramic matrix and a metal matrix.

6. The method of claim 1, wherein the copper nanoparticles are at least partially fused together by applying heat.

7. The method of claim 1, wherein the copper nanoparticles are at least partially fused together by applying pressure.

8. The method of claim 1, wherein the bidentate diamine comprises an N,N'-dialkylethylenediamine.

9. The method of claim 1, wherein the paste contains the copper nanoparticles in an amount of about 50% or higher by weight.

10. A method comprising:
    providing a plurality of copper nanoparticles that are mixed with a matrix material to form a paste:
        wherein the plurality of copper nanoparticles are less than about 20 nm in size and further comprise a surfactant system comprising a bidentate diamine and one or more C6-C18 alkylamines;
    placing the paste in a joint between a first member and a second member; and
    joining the first member to the second member by at least partially fusing the plurality of copper nanoparticles together.

11. The method of claim 10, wherein the matrix material is selected from the group consisting of a polymer matrix, a rubber matrix, a glass matrix, a ceramic matrix and a metal matrix.

12. The method of claim 10, wherein the copper nanoparticles are at least partially fused together by applying heat.

13. The method of claim 10, wherein the copper nanoparticles are at least partially fused together by applying pressure.

14. The method of claim 10, wherein the paste contains the copper nanoparticles in an amount of about 50% or higher by weight.

15. The method of claim 10, wherein the N,N'-dialkylethylenediamine comprises N,N'-di-t-butylethylenediamine.

16. The method of claim 10, further comprising:
    removing the matrix material after at least partially fusing the copper nanoparticles together.

* * * * *